United States Patent
Inokuchi et al.

(10) Patent No.: US 6,270,581 B1
(45) Date of Patent: Aug. 7, 2001

(54) WET-OXIDATION APPARATUS AND WET-OXIDATION METHOD

(75) Inventors: Yasuhiro Inokuchi; Fumihide Ikeda, both of Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/022,620

(22) Filed: Feb. 12, 1998

(30) Foreign Application Priority Data

Feb. 12, 1997 (JP) .................................................. 9-043050

(51) Int. Cl.[7] .............................. B05C 11/00; C23C 16/00
(52) U.S. Cl. ...................... 118/696; 118/697; 118/698; 118/715; 118/719
(58) Field of Search ..................................... 118/719, 715, 118/720, 724, 696, 697, 698

(56) References Cited

U.S. PATENT DOCUMENTS

| | | | |
|---|---|---|---|
| 4,315,479 | * 2/1982 | Toole et al. ........................ | 118/726 |
| 5,186,120 | * 2/1993 | Ohnishi et al. ..................... | 118/667 |
| 5,234,501 | * 8/1993 | Nakao et al. ....................... | 118/719 |
| 5,551,984 | * 9/1996 | Tanahashi .......................... | 118/724 |
| 5,810,929 | * 9/1998 | Yuuki ................................ | 118/697 |
| 5,968,593 | * 10/1999 | Sakamoto et al. .................. | 118/715 |

FOREIGN PATENT DOCUMENTS

| | | |
|---|---|---|
| 5206033 | 8/1993 | (JP) . |
| 10070113A | 3/1998 | (JP) . |

* cited by examiner

*Primary Examiner*—Paul Thibodeau
*Assistant Examiner*—Monique R Jackson

(57) ABSTRACT

A wet-oxidation apparatus comprises a reaction tube capable of accommodating a semiconductor wafer; a water vapor generating apparatus for generating water vapor; a gas supply passage for supplying gas into the reaction tube; a discharge passage; an inert gas supply unit for supplying an inert gas; a gas switching unit capable of switching between the water vapor from the water vapor generating unit and the inert gas from the inert gas supply unit, so as to supply either one of the water vapor and the inert gas to the gas supply passage; and a control unit controlling such that: at least while wet-oxidation processing of the semiconductor wafer are conducted predetermined times in the reaction tube, the water vapor generating apparatus continuously generates the water vapor; whenever the wet-oxidation processing is started one time, the water vapor from the water vapor generating apparatus is switched toward the gas supply passage; and whenever the wet-oxidation processing is completed one time, the water vapor from the water vapor generating apparatus is switched toward the discharge passage, and the inert gas from the inert gas supply unit is supplied to the gas supply passage.

27 Claims, 2 Drawing Sheets

WET-OXIDATION APPARATUS AND WET-OXIDATION METHOD

BACKGROUND OF THE INVENTION

1. Field of the Invention

The present invention relates to a wet-oxidation apparatus which is a kind of semiconductor manufacturing apparatus, and to a wet-oxidation method.

2. Description of the Related Art

In a conventional wet-oxidation apparatus, a combustion-starting operation and a combustion-completing operation are conducted for every set of processing wafer which may be a single wafer or a small number of wafers. This is a cause of a lowering of throughput of the apparatus.

SUMMARY OF THE INVENTION

Thereupon, it is a main object of the present invention to provide a wet-oxidation apparatus and a wet-oxidation method which can suppress or prevent the throughput from being lowered and which can exhibit an excellent productivity.

According to a first aspect of the present invention, there is provided a wet-oxidation apparatus, comprising:

a reaction tube capable of accommodating a semiconductor wafer or semiconductor wafers;

a water vapor generating apparatus for generating water vapor;

a gas supply passage for supplying gas into the reaction tube;

a discharge passage; and a gas switching unit capable of switching the water vapor from the water vapor generating apparatus into either one of the gas supply passage and the discharge passage.

According to a second aspect of the present invention, there is provided a wet-oxidation apparatus, comprising:

a reaction tube capable of accommodating a semiconductor wafer or semiconductor wafers;

a water vapor generating apparatus for generating water vapor;

an inert gas supply unit for supplying an inert gas;

a gas supply passage for supplying gas into the reaction tube;

a gas switching unit capable of switching between the water vapor from the water vapor generating unit and the inert gas from the inert gas supply unit so as to supply either one of the water vapor and the inert gas to the gas supply passage.

According to a third aspect of the present invention, there is provided a wet-oxidation apparatus, comprising:

a reaction tube capable of accommodating a semiconductor wafer or semiconductor wafers;

a water vapor generating apparatus for generating water vapor; and a control unit controlling such that:

at least while wet-oxidation processing of the semiconductor wafer or wafers are conducted predetermined times in the reaction tube, the water vapor generating apparatus continuously generates water vapor;

whenever the wet-oxidation processing is started one time, the water vapor from the water vapor generating apparatus is supplied to the gas supply passage; and whenever the wet-oxidation processing is completed one time, a supply of the water vapor from the water vapor generating apparatus into the reaction tube is stopped.

According to a fourth aspect of the present invention, there is provided a wet-oxidation method, wherein at least while wet-oxidation processing of a semiconductor wafer or semiconductor wafers are conducted predetermined times in a reaction tube, a water vapor generating apparatus continuously generates water vapor;

whenever the wet-oxidation processing is started one time, the water vapor from the water vapor generating apparatus is supplied to the reaction tube to conduct the wet-oxidation processing of the semiconductor wafer or wafers; and whenever the wet-oxidation processing is completed one time, the water vapor from the water vapor generating apparatus is switched toward a discharge passage.

According to a fifth aspect of the present invention, there is provided a wet-oxidation method, wherein at least while wet-oxidation processing of a semiconductor wafer or semiconductor wafers are conducted predetermined times in a reaction tube, a water vapor generating apparatus continuously generates water vapor;

whenever the wet-oxidation processing is started one time, the water vapor from the water vapor generating apparatus is supplied to the reaction tube to conduct the wet-oxidation processing of the semiconductor wafer or wafers; and whenever the wet-oxidation processing is completed one time, the water vapor from the water vapor generating apparatus is switched to the inert gas from the inert gas supply unit so as to supply the inert gas to the reaction tube.

According to a sixth aspect of the present invention, there is provided a wet-oxidation method, wherein at least while wet-oxidation processing of a semiconductor wafer or semiconductor wafers are conducted predetermined times in a reaction tube, a water vapor generating apparatus continuously generates water vapor;

whenever the wet-oxidation processing is started one time, the water vapor from the water vapor generating apparatus is supplied to the reaction tube to conduct the wet-oxidation processing of the semiconductor wafer or wafers; and whenever the wet-oxidation processing is completed one time, a supply of the water vapor from the water vapor generating apparatus into the reaction tube is stopped.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENT

Figure 1:
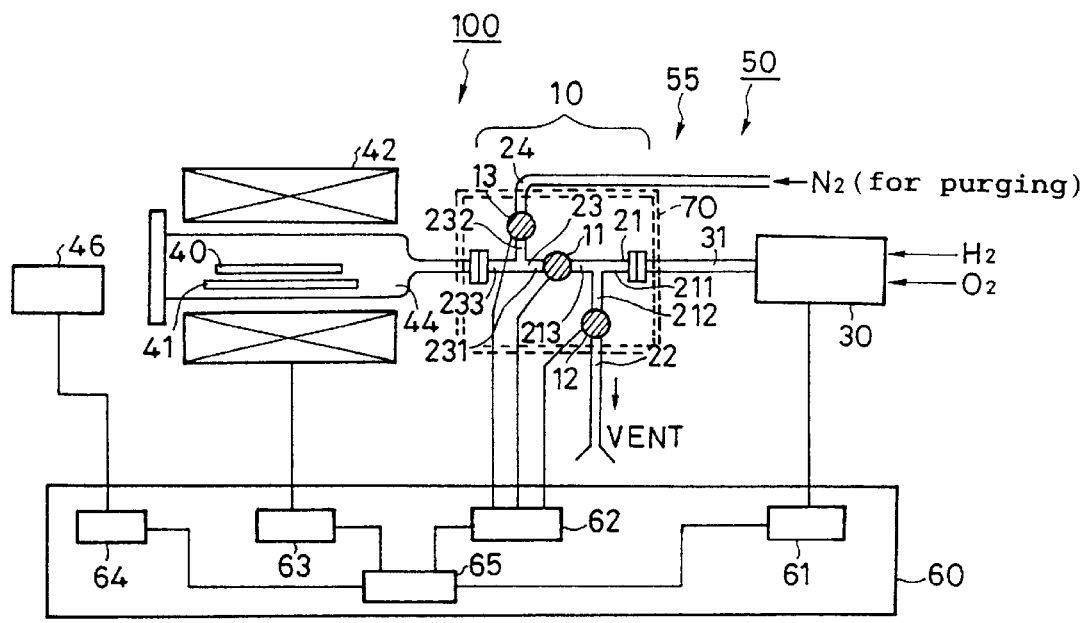
FIG. 1 is a schematic illustration for explaining a wet-oxidation apparatus according to an embodiment of the present invention.

Referring to FIG. 1, a wet-oxidation apparatus 100 according to an embodiment of the present invention includes a heating section 42, a reaction tube 44, a wafer transfer apparatus 46, a water vapor supply apparatus 50 and a control apparatus 60.

The water vapor supply apparatus 50 includes an outer combustion apparatus 30 and a gas pipe 55. A hydrogen pipe and an oxygen pipe are connected to the outer combustion apparatus 30. The outer combustion apparatus 30 is of a lamp-burning type, and includes a combustion lamp (not shown).

The gas pipe 55 includes a gas branching section 10, a nitrogen gas supply pipe 24 and a discharging pipe 22. The outer combustion apparatus 30 and the nitrogen gas supply pipe 24 are connected to the reaction tube 44 through the gas branching section 10. More specifically, the gas branching section 10 includes two T-shaped branching pipes 21 and 23, as well as valves 11 to 13. The T-shaped branching pipe 21 includes mutually communicated three branch pipes 211 to 213, and the T-shaped branching pipe 23 includes mutually communicated three branches 231 to 233. A pipe 31 is connected to the outer combustion apparatus 30, and the pipe 31 is connected to the branch pipe 211 of the T-shaped branching pipe 21. The branch pipe 212 of the T-shaped branching pipe 21 is connected to the discharging pipe 22 through the valve 12. The branch pipe 213 of the T-shaped branching pipe 21 is connected to the branch pipe 231 of the T-shaped branching pipe 23 through the valve 11. The branch pipe 232 of the T-shaped branching pipe 23 is connected to the nitrogen gas supply pipe 24 through the valve 13. The branch pipe 233 of the T-shaped branching pipe 23 is connected to the reaction tube 44.

Water vapor from the outer combustion apparatus 30 is supplied to the reaction tube 44 by opening the valve 11, and is discharged from the discharging pipe 22 by opening the valve 12. Nitrogen gas from the nitrogen gas supply pipe 24 is supplied to the reaction tube 44 by opening the valve 13, and the supply is stopped by closing the valve 13.

The reaction tube 44 is provided in the heating section 42. In the reaction tube 44, there is provided a wafer mount 41 for mounting, thereon, a single or a small number of semiconductor wafers 40. The semiconductor wafer 40 is transferred onto the wafer mount 41 in the reaction tube 44 by a wafer transfer apparatus 46, and when wet-oxidation is completed, the semiconductor wafer 40 is transferred out from the reaction tube 44 by the wafer transfer apparatus 46.

The control apparatus 60 includes: an outer-combustion-apparatus control section 61 for controlling the outer combustion apparatus 30; a valve control section 62 for controlling the valves 11 to 13; a heating-section control section 63 for controlling the heating section 42; a wafer-transfer-apparatus control section 64 for controlling the wafer transfer apparatus 46; and a supervisory control section 65 for controlling the outer-combustion-apparatus control section 61, the valve control section 62, the heating-section control section 63, and the wafer-transfer-apparatus control section 64.

In order to conduct the wet-oxidation of the semiconductor wafer 40 using this wet-oxidation apparatus 100, the reaction tube 44 is provided in the heating section 42 to first heat the inside of the reaction tube 44 by the heating section 42 up to a predetermined temperature. In addition, the supply of oxygen ($O_2$) gas to the outer combustion apparatus 30 is started, and at the same time, the combustion lamp (not shown) of the outer combustion apparatus 30 is turned on. After a predetermined time is elapsed, the supply of hydrogen ($H_2$) gas to the outer combustion apparatus 30 is started to start burning the hydrogen gas. Then, the combustion lamp (not shown) of the outer combustion apparatus 30 is turned off, but the supply of each of the oxygen gas and hydrogen gas to the outer combustion apparatus 30 is continued to burn the hydrogen and to generate water vapor. At that time, the valve 11 is closed and the valve 12 is opened to discharge the generated water vapor through the pipe 31, the T-shaped branching pipe 21, the valve 12 and the discharging pipe 22. Further, the valve 13 is opened for allowing the nitrogen gas to flow from the nitrogen gas supply pipe 24 into the reaction tube 44 through the valve 13 and the T-shaped branching pipe 23, thereby bringing the inside of the reaction tube 44 into a purge processing state . . . Step 1.

Thereafter, in this state, a semiconductor wafer 40 is mounted on the wafer mount 41 in the reaction tube 44 by the wafer transfer apparatus 46 . . . Step 2.

Next, the valve 13 is closed to stop the supply of nitrogen gas from the nitrogen gas supply pipe 24 to the reaction tube 44. The valve 12 is closed and the valve 11 is opened to supply water vapor from the outer combustion apparatus 30 into the reaction tube 44, and the wet-oxidation processing of the semiconductor wafer 40 is conducted . . . Step 3.

The wet-oxidation processing is conducted after a condition of water vapor generated by the outer combustion apparatus 30 is stabilized.

Next, the valve 11 is closed and the valve 12 is opened to flow and discharge water vapor from the outer combustion apparatus 30 toward the discharging pipe 22, and the valve 13 is opened to flow nitrogen gas from the nitrogen gas supply pipe 24 into the reaction tube 44 to purge the inside thereof . . . Step 4.

Next, after the inside of the reaction tube 44 has sufficiently been purged with nitrogen gas, the semiconductor wafer 40 on the wafer mount 41 is transferred out from the reaction tube 44 by the wafer transfer apparatus 46 . . . Step 5.

Then, the above-described Steps 2 to 5 are repeated predetermined times, and a predetermined number of semiconductor wafers 40 are subjected to the wet-oxidation processing . . . Step 6.

After that, the supply of hydrogen gas is stopped to terminate the combustion of hydrogen gas and then, the supply of oxygen gas is also stopped to complete the wet-oxidation processing . . . Step 7.

Table 1 shows opening and closing states of the valves 11, 12 and 13 during the wet-oxidation processing and purge processing.

TABLE 1

|  | valve 11 | valve 12 | valve 13 |
| --- | --- | --- | --- |
| Wet-oxidation processing | open | close | close |
| Purge processing | close | open | open |

In the present embodiment, hydrogen is always burning in the outer combustion apparatus 30, and a path for supplying generated water vapor to the reaction tube 44 only when it is necessary and for discharging the water vapor when it is unnecessary, is provided. Therefore, it is unnecessary to conduct the combustion-starting operation and the combustion-completing operation for every semiconductor wafer, and it is possible to enhance the throughput.

Figure 3:
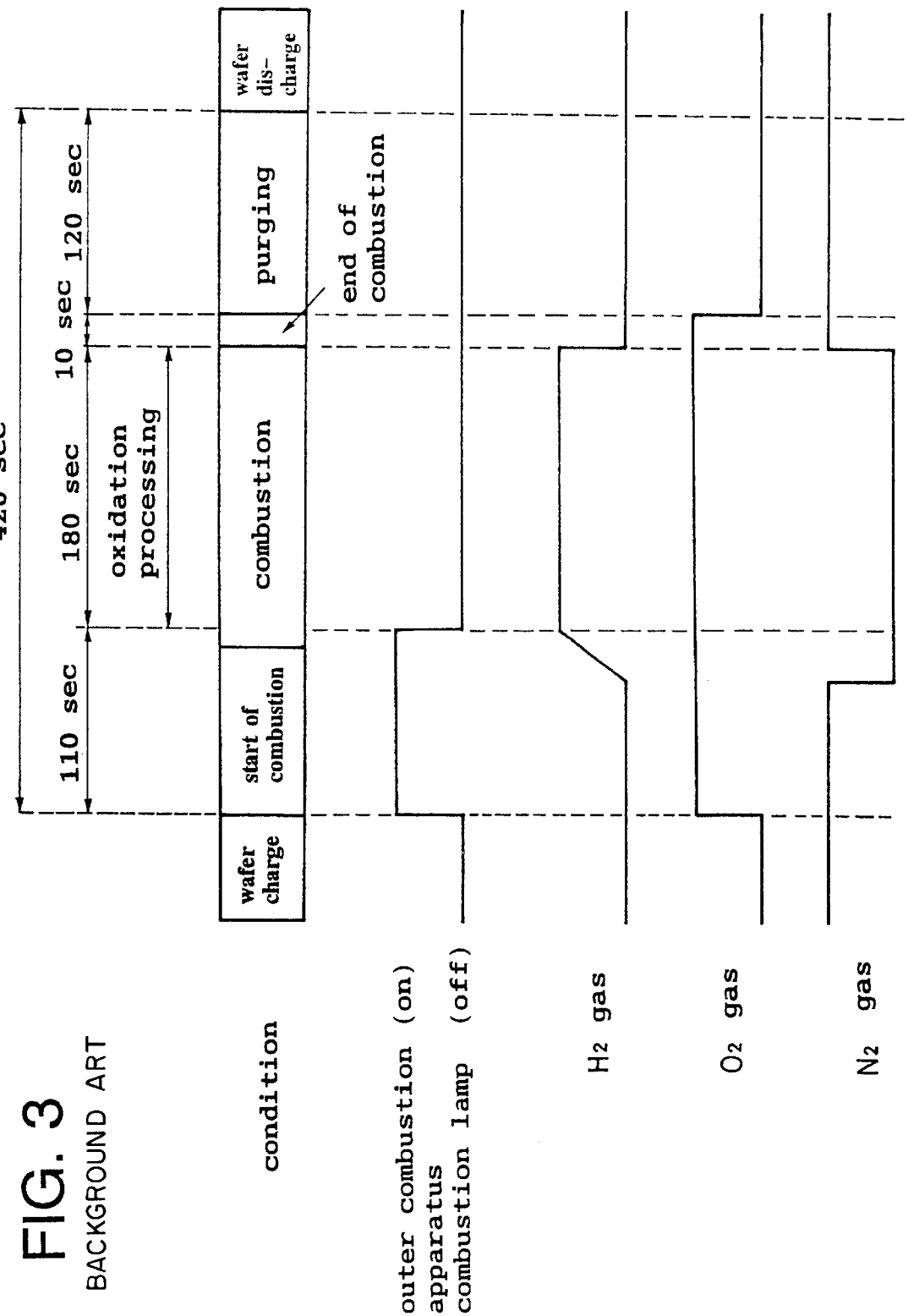
FIG. 3 is a diagram for explaining a sequence of the wet-oxidation using the comparative wet-oxidation apparatus.

That is, because it is unnecessary to conduct the combustion-starting operation and the combustion-completing operation for every single semiconductor wafer as in the comparative wet-oxidation method shown in FIG. 3, a processing time from a time point when a charging operation of wafer is completed to a time point when a discharging operation of wafer is started is shortened about 30% (from 420 seconds to 300 seconds). Therefore, a time required for wet-oxidation processing a predetermined number of semiconductor wafers is shortened accordingly.

In a batch process in which many (100 or more) semiconductor wafers are subjected to the wet-oxidation processing at a time, many semiconductor wafers are simultaneously subjected to the wet-oxidation processing and a processing time is relatively long. Therefore, after many wafers are charged into the reaction tube, even if the combustion-starting operation and the combustion-completing operation of the outer combustion apparatus are conducted, the throughput is not influenced almost at all. However, when the wet-oxidation processing is conducted for every single wafer or a small number of wafers, if the combustion-starting operation and the combustion-completing operation of the outer combustion apparatus are conducted for every processing, the throughput is lowered, and lifetimes of the lamp and the like of the outer combustion apparatus are shortened. Therefore, the present invention provides a remarkable effect especially when the wet-oxidation processing is conducted for every single wafer or a small number of wafers.

Further, because a combustion is always kept in the outer combustion apparatus 30, water vapor can be supplied stably and as a result, a wet-oxidized film having stable properties can be obtained.

Although the number of wafers to be processed in one wet-oxidation processing is one, because it is unnecessary to frequently repeat the on/off operations of the combustion lamp of the outer combustion apparatus 30, the lifetime of the lamp is prevented from being shortened, and the number of exchanges of lamps can be reduced.

Further, it is possible to swiftly complete the wet-oxidation by water vapor by switching from water vapor to nitrogen gas, and the subsequent exchange of semiconductor wafers can swiftly and easily be conducted.

Furthermore, because the wet-oxidation processing of the semiconductor wafer is started after a condition of water vapor generated by the outer combustion apparatus 30 is stabilized, a wet-oxidized film having stable properties can be formed.

The gas branching section 10 is heated to about 150° C. so as to prevent a condensation of water vapor. Each of the valves 11 to 13 should be of heat-resistant material so that it can resist the heating temperature An inner surface of each of the valves 11 to 13 and metal pipes 31, 21 and 23 is subjected to a surface treatment which provides the inner surface with chromic oxide for preventing pollution.

The gas branching section 10 may be provided in the outer combustion apparatus 30.

Although the semiconductor wafers 40 are processed one by one in the above-described embodiment, the present invention can also be applied to a case in which a small number of (two to ten) wafers are processed in the reaction tube 44 at a time. The present invention is especially effective when one or two wafers are processed at a time.

Comparative Example

Figure 2:
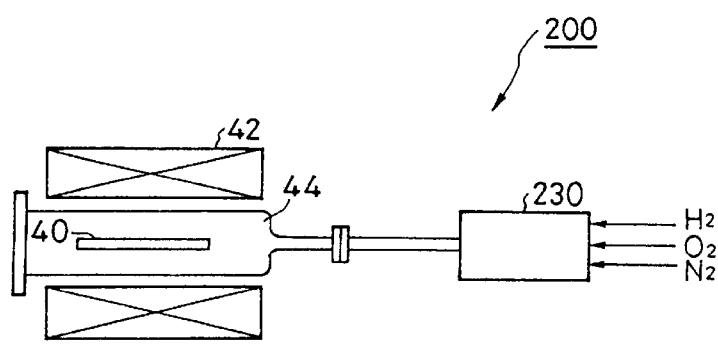
FIG. 2 is a schematic illustration for explaining a conventional wet-oxidation apparatus for comparison.

FIG. 2 is a schematic illustration for explaining a wet-oxidation apparatus for comparison (which will be referred to as a "comparative wet-oxidation apparatus hereinafter). FIG. 3 is a diagram for explaining a sequence of the wet-oxidation using the comparative wet-oxidation apparatus.

The comparative wet-oxidation apparatus 200 includes a heating section 42, a reaction tube 44 and an outer combustion apparatus 230. The outer combustion apparatus 230 is directly connected to the reaction tube 44. A hydrogen pipe, an oxygen pipe and a nitrogen pipe are connected to the outer combustion apparatus 230.

In order to conduct the wet-oxidation of a semiconductor wafer using this comparative wet-oxidation apparatus 200, the reaction tube 44 is provided in the heating section 42, and while the inside of the reaction tube 44 is heated by the heating section 42, a single or a small number of semiconductor wafers 40 are first mounted in the reaction tube 44 as shown in FIG. 3 (wafer charging step). Next, a supply of oxygen ($O_2$) gas to the outer combustion apparatus 230 is started, and at the same time, a combustion lamp (not shown) of the outer combustion apparatus 230 is turned on. After a predetermined time is elapsed, a supply of nitrogen ($N_2$) gas to the outer combustion apparatus 230 is stopped, and at the same time, a supply of hydrogen ($H_2$) gas to the outer combustion apparatus 230 is started to start burning the hydrogen gas (combustion-starting step). Then, the combustion lamp (not shown) of the outer combustion apparatus 230 is turned off, but the supply of each of oxygen gas and hydrogen gas to the outer combustion apparatus 230 is continued to burn hydrogen to generate water vapor (combustion step). The generated water vapor is supplied into the reaction tube 44 to conduct the wet-oxidation processing of the semiconductor wafer 40. Then, the supply of hydrogen gas is stopped, and at the same time, a supply of nitrogen gas to the outer combustion apparatus 230 is started to complete the combustion of hydrogen gas (combustion-completing step). After that, the supply of oxygen gas is also stopped for allowing only nitrogen gas to flow into the reaction tube 44 (purging step). After a predetermined time is elapsed, the semiconductor wafer 40 is or semiconductor wafers 40 are taken out from the reaction tube 44 while nitrogen gas is left flowing into the reaction tube 44 (wafer discharging step). Then, a single semiconductor wafer is or a small number of semiconductor wafers 40 are again mounted into the reaction tube 44. Thereafter, the above-described steps are repeated, and the wet-oxidation of the semiconductor wafer is conducted predetermined times.

As described above, if the comparative wet-oxidation apparatus is used, the combustion-starting operation and the combustion-completing operation must be conducted for every single wafer or every small number of wafers, which lowers the throughput of the apparatus.

Further, in the outer combustion apparatus 230, hydrogen and oxygen are reacted by lamp-heating (or resistance heating) or catalytic heating, thereby generating the water vapor, as described above. In this case, if a single sheet of wafer is or a small number of sheets of wafers are processed, it is necessary to change-over between a supply of the water vapor and a cut of the supply thereof very frequently in a short time for every wet-oxidation processing, wafer exchanging and next wet-oxidation processing. Therefore, when a lamp is used for example, it is necessary to frequently repeat on/off operations of the lamp, which shortens the lifetime of the lamp.

Furthermore, as described above, when a single sheet of wafer is or a small number of sheets of wafers are processed, a change-over between a supply of the water vapor and a cut of the supply thereof is conducted for every processing wafer or wafers. However, it takes time in order to supply stable water vapor, which greatly influences the throughput when a single sheet of wafer is or a small number of sheets of wafers are processed.

In addition, because a condition of water vapor is not stable at the initial stage of combustion, the properties of wet-oxide film are not stable accordingly.

According to a first aspect of the above-described preferred embodiments, there is provided a first wet-oxidation apparatus, comprising:
a reaction tube capable of accommodating a semiconductor wafer or semiconductor wafers;
a water vapor generating apparatus for generating water vapor;
a gas supply passage for supplying gas into the reaction tube;
a discharge passage; and
a gas switching unit capable of switching the water vapor from the water vapor generating apparatus into either one of the gas supply passage and the discharge passage.

If the wet-oxidation apparatus is provided with the gas switching unit capable of switching the water vapor from the water vapor generating apparatus into either one of the gas supply passage and the discharge passage, while the water vapor generating apparatus keeps generating the water vapor continuously, passages through which the water vapor flows can be switched, so that the wet-oxidation processing can be started and completed for every processing wafer or wafers. Therefore, it is unnecessary to conduct the water vapor generation-starting operation and the water vapor generation-completing operation for every wet processing, and the throughput is enhanced accordingly.

Further, even if the number of wafers which are to be subjected to the wet-oxidation processing at a time is one or a small number, it is possible to suppress or prevent the number of maintenance of the water vapor generating apparatus from being increased. For example, in the case of a lamp-combustion type water vapor generating apparatus, it is unnecessary to frequently repeat the on/off operations of the combustion lamp, which prevents the lifetime of the lamp from being shortened, and the number of exchanges of lamps can be reduced.

Furthermore, even if a single sheet of wafer is or a small number of sheets of wafers are to be processed, it is unnecessary to conduct the starting operation and the completing operation of the water vapor generation by the water vapor generating apparatus for every wet-oxidation processing, and it is possible to keep generating the water vapor by the water vapor generating apparatus during a predetermined number of wet-oxidation processing. Therefore, it is possible to stably supply the water vapor from the beginning of every wet-oxidation processing. As a result, even if a single sheet of wafer is or a small number of sheets of wafers are to be processed, it is possible to suppress or prevent the throughput from being lowered, and to provide a high productivity.

In addition, because it is possible to leave the water vapor generating apparatus generating the water vapor before a wet-oxidation processing is started and during a predetermined number of wet-oxidation processing, even if a condition of water vapor is not stable at an initial stage of the water vapor generation by the water vapor generating apparatus, such an inconvenience can be overcome by switching the water vapor from the water vapor generating apparatus toward the gas supply passage by means of a gas switching unit after the condition of the water vapor is stabilized. Therefore, properties of the wet-oxidized film obtained is also stabilized.

Further, because there is provided the gas switching unit capable of switching the water vapor from the water vapor generating apparatus into one of the gas supply passage and the discharge passage, when a wet-oxidation processing is not conducted in the reaction tube, it is possible to keep flowing the water vapor from the water vapor generating apparatus into the discharge passage. As a result, it is possible to leave the water vapor flowing at a constant flow rate whether or not a wet-oxidation processing is conducted. Therefore, even if a mass flow controller is used for controlling a flow rate of the water vapor from the water vapor generating apparatus, it is possible to reduce a flow rate variation due to switching of the water vapor to the gas supply passage, and a wet-oxidized film having stable properties can be obtained with excellent repeatability accordingly.

Preferably, the first wet-oxidation apparatus further comprises an inert gas supply unit for supplying an inert gas,
wherein the gas switching unit switches between the water vapor from the water vapor generating unit and the inert gas from the inert gas supply unit, so as to supply either one of the water vapor and the inert gas to the gas supply passage.

As described above, by switching to the inert gas, a wet-oxidation by water vapor can swiftly be finished, and a subsequent exchange of semiconductor wafers can also be conducted swiftly and easily.

Preferably, when wet-oxidation of the semiconductor wafer or wafers is conducted, a supply of the inert gas from the inert gas supply unit to the gas supply passage is stopped, and the water vapor from the water vapor generating unit is supplied to the gas supply passage, and
when the wet-oxidation of the semiconductor wafer or wafers is not conducted, the water vapor from the water vapor generating unit is not supplied to the gas supply passage and is discharged by the discharge passage, and the inert gas from the inert gas supply unit is supplied to the gas supply passage.

Preferably, the first wet-oxidation apparatus further comprises a control unit capable of controlling the water vapor generating apparatus and the gas switching unit, wherein
the control unit controls such that:
at least while wet-oxidation processing of the semiconductor wafer or wafers are conducted predetermined times in the reaction tube, the water vapor generating apparatus continuously generates the water vapor;
whenever the wet-oxidation processing is started one time, the water vapor from the water vapor generating apparatus is switched toward the gas supply passage; and
whenever the wet-oxidation processing is completed one time, the water vapor from the water vapor generating apparatus is switched toward the discharge passage.

Preferably, the first wet-oxidation apparatus further comprises an inert gas supply unit for supplying an inert gas,
wherein the gas switching unit switches between the water vapor from the water vapor generating unit and the inert gas from the inert gas supply unit, so as to supply either one of the water vapor and the inert gas to the gas supply passage, and wherein the control unit controls such that:
at least while wet-oxidation processing of the semiconductor wafer or wafers are conducted predetermined times in the reaction tube, the water vapor generating apparatus continuously generates the water vapor;
whenever the wet-oxidation processing is started one time, the water vapor from the water vapor generating apparatus is switched toward the gas supply passage; and
whenever the wet-oxidation processing is completed one time, the water vapor from the water vapor generating apparatus is switched toward the discharge passage, and the inert gas from the inert gas supply unit is supplied to the gas supply passage.

In the wet-oxidation apparatus having the above-described control apparatuses, also before a predetermined times of wafer processing is started, it is preferable to leave the water vapor generating apparatus generating the water vapor, and after a condition of the water vapor is stabilized, the water vapor from the water vapor generating apparatus is switched toward the gas supply passage.

According to a second aspect of the above-described preferred embodiments, there is provided a second wet oxidation apparatus, comprising:
a reaction tube capable of accommodating a semiconductor wafer or semiconductor wafers;
a water vapor generating apparatus for generating water vapor;
an inert gas supply unit for supplying an inert gas;
a gas supply passage for supplying gas into the reaction tube;
a gas switching unit capable of switching between the water vapor from the water vapor generating unit and the inert gas from the inert gas supply unit so as to supply either one of the water vapor and the inert gas to the gas supply passage.

In the wet-oxidation apparatus of this structure, while the water vapor generating apparatus keeps generating the water vapor continuously, kinds of gasses flowing into the reaction tube are switched so that the wet-oxidation processing can be started and completed for every processing wafer or wafers. Therefore, it is unnecessary to conduct the water vapor generation-starting operation and the water vapor generation-completing operation for every wet processing, and the throughput is enhanced accordingly.

Further, even if the number of wafers which are to be subjected to the wet-oxidation processing at a time is one or a small number, it is possible to suppress or prevent the number of maintenance of the water vapor generating apparatus from being increased.

Furthermore, because it is possible to keep generating the water vapor by the water vapor generating apparatus during a predetermined number of wet-oxidation processing, even if a single sheet of wafer is or a small number of sheets of wafers are to be processed, it is possible to suppress or prevent the throughput from being lowered and to provide a high productivity, and properties of the wet-oxidized film obtained is also stabilized.

Preferably the second wet-oxidation apparatus further comprises a control unit capable of controlling the water vapor generating apparatus and the gas switching unit, wherein
the control unit controls such that:
at least while wet-oxidation processing of the semiconductor wafer or wafers are conducted predetermined times in the reaction tube, the water vapor generating apparatus continuously generates the water vapor;
whenever the wet-oxidation processing is started one time, the water vapor from the water vapor generating apparatus is switched toward the gas supply passage; and
whenever the wet-oxidation processing is completed one time, the water vapor from the water vapor generating apparatus is switched to the inert gas from the inert gas supply unit so as to supply the inert gas to the gas supply passage.

In this case, also before a predetermined number of wafer processing is started, it is preferable to leave the water vapor generating apparatus generating the water vapor, and after a condition of the water vapor is stabilized, the water vapor from the water vapor generating apparatus is switched toward the gas supply passage.

According to a third aspect of the above-described preferred embodiments, there is provided a third wet-oxidation apparatus, comprising:
a reaction tube capable of accommodating a semiconductor wafer or semiconductor wafers;
a water vapor generating apparatus for generating water vapor; and
a control unit controlling such that:
at least while wet-oxidation processing of the semiconductor wafer or wafers are conducted predetermined times in the reaction tube, the water vapor generating apparatus continuously generates water vapor;
whenever the wet-oxidation processing is started one time, the water vapor from the water vapor generating apparatus is supplied to the gas supply passage; and
whenever the wet-oxidation processing is completed one time, a supply of the water vapor from the water vapor generating apparatus into the reaction tube is stopped.

In the wet-oxidation apparatus of this structure, while the water vapor generating apparatus keeps generating the water vapor continuously, a supply of the water vapor into the reaction tube is controlled so that the wet-oxidation processing can be started and completed for every processing wafer or wafers. Therefore, it is unnecessary to conduct the water vapor generation-starting operation and the water vapor generation-completing operation for every wet processing, and the throughput is enhanced accordingly.

Further, even if the number of wafers which are to be subjected to the wet-oxidation processing at a time is one or a small number, it is possible to suppress or prevent the number of maintenance of the water vapor generating apparatus from being increased.

Furthermore, because it is possible to keep generating the water vapor by the water vapor generating apparatus during a predetermined number of wet-oxidation processing, even if a single sheet of wafer is or a small number of sheets of wafers are to be processed, it is possible to suppress or prevent the throughput from being lowered and to provide a high productivity, and properties of the wet-oxidized film obtained is also stabilized.

In this case, also before a predetermined number of wafer processing is started, it is preferable to leave the water vapor generating apparatus generating the water vapor, and after a condition of the water vapor is stabilized, the wet-oxidation processing is completed by a supply of the water vapor from the water vapor generating apparatus into the reaction tube.

Preferably, the control unit controls such that the water vapor is previously generated by the water vapor generating apparatus, and after a condition of the water vapor is stabilized, the wet-oxidation processing is conducted the predetermined times.

As described above, if the wet-oxidation processing is conducted predetermined times after a condition of the water vapor generated by the water vapor generating apparatus is stabilized, a wet-oxidized film having stable properties can be produced.

Preferably, the wet-oxidation processing is conducted every one semiconductor wafer.

Preferably, the wet-oxidation processing is conducted every one semiconductor wafer or every two semiconductor wafers.

Preferably, the wet-oxidation processing is conducted every two to ten semiconductor wafers.

Preferably, the water vapor generating apparatus burns hydrogen to generate water vapor.

In the present invention, especially when the water vapor generating apparatus generates water vapor by burning hydrogen, the above-described effects can be exhibited remarkably.

Preferably, the gas switching unit includes a gas branching section having a branching pipe and a plurality of valves, and the wet-oxidation apparatus further includes a high-temperature keeping unit 70 for keeping the branching pipe and the plurality of valves at a high temperature.

With the above described design, it is possible to prevent condensation of water vapor in the gas branching section. Preferably, the branching pipe and the plurality of valves are heated to about 150° C. Each of the valves should be of heat-resistant so that it can resist the heating temperature.

According to a fourth aspect of the above-described preferred embodiments, there is provided a first wet-oxidation method, wherein at least while wet-oxidation processing of a semiconductor wafer or semiconductor wafers are conducted predetermined times in a reaction tube, a water vapor generating apparatus continuously generates water vapor;

whenever the wet-oxidation processing is started one time, the water vapor from the water vapor generating apparatus is supplied to the reaction tube to conduct the wet-oxidation processing of the semiconductor wafer or wafers; and whenever the wet-oxidation processing is completed one time, the water vapor from the water vapor generating apparatus is switched toward a discharge passage.

Preferably, at least while the wet-oxidation processing of the semiconductor wafer or wafers are conducted the predetermined times in the reaction tube, the water vapor generating apparatus continuously generates the water vapor;

whenever the wet-oxidation processing is started one time, the water vapor from the water vapor generating apparatus is supplied to the reaction tube to conduct the wet-oxidation processing of the semiconductor wafer or wafers; and whenever the wet-oxidation processing is completed one time, the water vapor from the water vapor generating apparatus is switched toward the discharge passage, and an inert gas from an inert gas supply unit is supplied to the reaction tube.

According to a fifth aspect of the above-described preferred embodiments, there is provided a second wet-oxidation method, wherein at least while wet-oxidation processing of a semiconductor wafer or semiconductor wafers are conducted predetermined times in a reaction tube, a water vapor generating apparatus continuously generates water vapor;

whenever the wet-oxidation processing is started one time, the water vapor from the water vapor generating apparatus is supplied to the reaction tube to conduct the wet-oxidation processing of the semiconductor wafer or wafers; and whenever the wet-oxidation processing is completed one time, the water vapor from the water vapor generating apparatus is switched to the inert gas from the inert gas supply unit so as to supply the inert gas to the reaction tube.

According to a sixth aspect of the above-described preferred embodiments, there is provided a third wet-oxidation method, wherein at least while wet-oxidation processing of a semiconductor wafer or semiconductor wafers are conducted predetermined times in a reaction tube, a water vapor generating apparatus continuously generates water vapor;

whenever the wet-oxidation processing is started one time, the water vapor from the water vapor generating apparatus is supplied to the reaction tube to conduct the wet-oxidation processing of the semiconductor wafer or wafers; and whenever the wet-oxidation processing is completed one time, a supply of the water vapor from the water vapor generating apparatus into the reaction tube is stopped.

In these wet-oxidation method, while the water vapor generating apparatus keeps generating water vapor continuously, a supply of the water vapor into the reaction tube is controlled so that the wet-oxidation processing can be started and completed for every processing wafer or wafers. Therefore, it is unnecessary to conduct the water vapor generation-starting operation and the water vapor generation-completing operation for every wet processing, and the throughput is enhanced accordingly.

Further, even if the number of wafers which are to be subjected to the wet-oxidation processing at a time is one or a small number, it is possible to suppress or prevent the number of maintenance of the water vapor generating apparatus from being increased.

Furthermore, because it is possible to keep generating the water vapor by the water vapor generating apparatus during a predetermined number of wet-oxidation processing, even if a single sheet of wafer is or a small number of sheets of wafers are to be processed, it is possible to suppress or prevent the throughput from being lowered and to provide a high productivity, and properties of the wet-oxidized film obtained is also stabilized.

Preferably, the water vapor is previously generated by the water vapor generating apparatus, and after a condition of the water vapor is stabilized, the wet-oxidation processing is conducted predetermined times by supplying the water vapor from the water vapor generating apparatus to the reaction tube.

As described above, if the wet-oxidation processing is conducted predetermined times after a condition of the water vapor generated by the water vapor generating apparatus is stabilized, a wet-oxidized film having stable properties can be produced.

Preferably, the wet-oxidation processing is conducted every one semiconductor wafer.

Preferably, the wet-oxidation processing is conducted every one semiconductor wafer or every two semiconductor wafers.

Preferably, the wet-oxidation processing is conducted every two to ten semiconductor wafers.

Preferably, the water vapor generating apparatus burns hydrogen to generate water vapor.

What is claimed is:

1. A wet-oxidation apparatus, comprising:
   a reaction tube capable of accommodating a semiconductor wafer or semiconductor wafers;
   a water vapor generating apparatus for generating water vapor;
   a gas supply passage for supplying gas into said reaction tube;
   a discharge passage;
   a gas switching unit capable of switching the water vapor from said water vapor generating apparatus into either one of said gas supply passage and said discharge passage; and
   a control unit capable of controlling said water vapor generating apparatus and said gas switching unit, wherein said control unit controls such that,
      at least while wet-oxidation processing of said semiconductor wafer or wafers is conducted predetermined times in said reaction tube, said water vapor generating apparatus continuously generates the water vapor,
      whenever said wet-oxidation processing is started one time, said control unit switches the water vapor from said water vapor generating apparatus toward said gas supply passage, and
      whenever said wet-oxidation processing is completed one time, said control unit switches the water vapor from said water vapor generating apparatus toward said discharge passage.

2. A wet-oxidation apparatus as recited in claim 1, further comprising an inert gas supply unit for supplying an inert gas,
   wherein said gas switching unit switches between the water vapor from said water vapor generating unit and the inert gas from said inert gas supply unit, so as to supply either one of said water vapor and said inert gas to said gas supply passage.

3. A wet-oxidation apparatus as recited in claim 2, wherein
   when wet-oxidation of said semiconductor wafer or wafers is conducted, a supply of the inert gas from said inert gas supply unit to said gas supply passage is stopped, and the water vapor from said water vapor generating unit is supplied to said gas supply passage, and
   when the wet-oxidation of said semiconductor wafer or wafers is not conducted, the water vapor from said water vapor generating unit is not supplied to said gas supply passage and is discharged by said discharge passage, and the inert gas from said inert gas supply unit is supplied to said gas supply passage.

4. A wet-oxidation apparatus as recited in claim 1, further comprising an inert gas supply unit for supplying an inert gas, wherein said gas switching unit switches between the water vapor from said water vapor generating unit and the inert gas from said inert gas supply unit, so as to supply either one of said water vapor and said to said gas supply passage, and
   wherein said control unit controls that
      whenever said wet-oxidation processing is completed one time, the water vapor from said water vapor generating apparatus is switched toward said discharge passage, and the inert gas from said inert gas supply unit is supplied to said gas passage.

5. A wet-oxidation apparatus as recited in claim 1, wherein said control unit controls such that the water vapor is previously generated by said water vapor generating apparatus, and after a condition of the water vapor is stabilized, the wet-oxidation processing is conducted the predetermined times.

6. A wet-oxidation apparatus as recited in claim 1, wherein said wet-oxidation processing is conducted every one semiconductor wafer.

7. A wet-oxidation apparatus as recited in claim 1, wherein said wet-oxidation processing is conducted every two to ten semiconductor wafers.

8. A wet-oxidation apparatus as recited in claim 1, wherein said water vapor generating apparatus burns hydrogen to generate the water vapor.

9. A wet-oxidation apparatus as recited in claim 1, wherein said gas switching unit includes a gas branching section having a branching pipe and a plurality of valves, and aid wet-oxidation apparatus further includes a high-temperature keeping unit for keeping said branching pipe and said plurality of valves at a high temperature.

10. The wet-oxidation apparatus of claim 1 wherein said water vapor generating apparatus continuously supplies said water vapor at the output thereof.

11. A wet-oxidation apparatus, comprising:
    a reaction tube capable of accommodating a seconds wafer or semiconductor wafers;
    a water vapor generating apparatus for generating water vapor;
    an inert gas supply unit for supplying an inert gas;
    a gas supply passage for supplying gas into said reaction tube;
    a gas switching unit capable of switching between the water vapor from said water vapor generating unit and the inert gas form said inert gas supply unit so as to supply either one of said water vapor and said inert gas to said gas supply passage; and
    a control unit capable of controlling said water vapor generating apparatus and said gas switching unit, wherein said control unit controls such that,
       at least while wet-oxidation processing of said semiconductor wafer or wafers is conducted predetermined times in said reaction tube, said water vapor generating apparatus continuously generates the water vapor,
       whenever said wet-oxidation processing is started one time, the water vapor from said water vapor generating apparatus is switched toward said gas supply passage,
       whenever said wet-oxidation processing is completed one time, the water vapor from said water vapor generating apparatus is switched to the inert gas from said inert gas supply unit so as to supply the inert gas to said gas supply passage.

12. A wet-oxidation apparatus as recited in claim 11, wherein said control unit controls such that the water vapor is previously generated by said water vapor generating apparatus, and after a condition of the water vapor is stabilized, the wet-oxidation processing is conducted the predetermined times.

13. A wet-oxidation apparatus as recited in claim 11, wherein said wet-oxidation processing is conducted every one semiconductor wafer.

14. A wet-oxidation apparatus as recited in claim 11, wherein said wet-oxidation processing is conducted every two to ten semiconductor wafers.

15. A wet-oxidation apparatus as recited in claim 11, wherein said water vapor generating apparatus burns hydrogen to generate the water vapor.

16. A wet-oxidation apparatus as recited in claim 11, wherein said gas switching unit includes a gas branching section having a branching pipe and a plurality of valves, an said wet-oxidation apparatus further includes a high-temperature keeping unit for keeping said branching pipe and said plurality of valves at a high temperature.

17. The wet-oxidation apparatus of claim 11 wherein said water vapor generating apparatus continuously supplies said water vapor at the output thereof.

18. A wet-oxidation apparatus, comprising:
   a reaction tube capable of accommodating a semiconductor wafer or semiconductor wafers;
   a water vapor generating apparatus for generating water vapor;
   a gas supply passage for supplying gas into said reaction tube; and
   a control unit controlling such that,
      at least while wet-oxidation processing of said semiconductor wafer or wafers is conducted predetermined times in said reaction tube, said water vapor generating apparatus continuously generates water vapor,
      whenever said wet-oxidation processing is started one time, the water vapor from said water vapor generating apparatus is supplied to said gas supply passage, and
      whenever said wet-oxidation processing is completed one time, a supply of the water vapor from said water vapor generating apparatus into said reaction tube is stopped.

19. A wet-oxidation apparatus as recited in claim 18, wherein said control unit controls such that the water vapor is previously generated by said water vapor generating apparatus, and after a condition of the water vapor is stabilized, the wet-oxidation processing is conducted the predetermined times.

20. A wet-oxidation apparatus as recited in claim 18, wherein said wet-oxidation processing is conducted every one semiconductor wafer.

21. A wet-oxidation apparatus as recited in claim 18, wherein said wet-oxidation processing is conducted every two to ten semiconductor wafers.

22. A wet-oxidation apparatus as recited in claim 18, wherein said water vapor generating apparatus burns hydrogen to generate the water vapor.

23. A wet-oxidation apparatus as recited in claim 18, further comprising:
   a gas switching unit including a gas branching section having a branching pipe and a plurality of valves, and a high-temperature keeping unit for keeping said branching pipe and said plurality of valves at a high temperature.

24. The wet-oxidation apparatus of claim 18 wherein said water vapor generating apparatus continuously supplies said water vapor at the output thereof.

25. A wet oxidation apparatus comprising:
   a reaction vessel capable of receiving one or more semiconductor wafers for wet oxidation thereof;
   a wafer transfer apparatus for selectively transferring wafers into or out of said reaction vessel;
   a water vapor generating apparatus for generating water vapor and for supplying said vapor to said reaction vessel;
   a gas supply passage for supplying gas into said reaction vessel;
   gas switching valuing for selectively supplying said water vapor from said water vapor generating apparatus and the gas from said gas supply passage to said reaction vessel, and for selectively venting said water vapor from said water vapor generating apparatus externally of said reaction vessel; and
   a control for controlling at least said gas switching valving and said wafer transfer apparatus, said control, after wet oxidation processing is performed on said one or more semiconductor wafers,
   controlling said gas switching valving to supply said gas from said gas supply passage and to vent said water vapor externally of said reaction vessel, and
   controlling said wafer transfer apparatus to transfer wafers into or out of said reaction vessel while water vapor generated by said water vapor generating apparatus is vented externally of said reaction vessel.

26. The wet oxidation apparatus of claim 25 wherein said gas is an inert gas.

27. The wet-oxidation apparatus of claim 25 wherein said water vapor generating apparatus continuously supplies said water vapor at the output thereof.

* * * * *